United States Patent [19]
Smith et al.

[11] Patent Number: 5,511,025
[45] Date of Patent: Apr. 23, 1996

[54] WRITE PER BIT WITH WRITE MASK INFORMATION CARRIED ON THE DATA PATH PAST THE INPUT DATA LATCH

[75] Inventors: Scott E. Smith, Sugar Land; Duy-Loan T. Le, Missouri; Michael Ho, Houston, all of Tex.

[73] Assignee: Texas Instruments Incorporated, Dallas, Tex.

[21] Appl. No.: 361,901

[22] Filed: Dec. 21, 1994

Related U.S. Application Data

[63] Continuation of Ser. No. 138,571, Oct. 18, 1993, abandoned.

[51] Int. Cl.⁶ ........................................ G11C 7/00
[52] U.S. Cl. .................. 365/189.05; 365/189.03; 365/189.01; 365/225.7; 365/230.03
[58] Field of Search ................ 365/195, 230.03, 365/189.05, 189.01, 219, 230.05, 96, 189.03, 189.09, 225.7

[56] References Cited

U.S. PATENT DOCUMENTS

| | | | |
|---|---|---|---|
| 4,817,058 | 3/1989 | Pinkham | 365/230.05 |
| 4,933,900 | 6/1990 | Yamaguchi et al. | 365/195 |
| 5,195,056 | 3/1993 | Pinkham et al. | 365/195 |
| 5,321,651 | 6/1994 | Monk | 365/189.05 |
| 5,323,346 | 6/1994 | Takahashi | 365/189.05 |

*Primary Examiner*—David C. Nelms
*Assistant Examiner*—Vu A. Le
*Attorney, Agent, or Firm*—Rich Donaldson; Leo Heiting; William W. Holloway

[57] ABSTRACT

A dynamic random access memory part 30 provides a write per bit feature by locating the respective write mask information latches 118 adjacent the respective local I/O buffers 116. The write mask information thus passes through the data latch 108 and across the data path to the local I/O buffer 116 before being latched. This reduces the area otherwise needed for the additional write mask lead, which in a x8, x16, x32 or x64 bit part can be intolerably large.

9 Claims, 4 Drawing Sheets

WRITE PER BIT WITH WRITE MASK INFORMATION CARRIED ON THE DATA PATH PAST THE INPUT DATA LATCH

This application is a Continuation of application Ser. No. 08/138,571, filed Oct. 18, 1993 now abandoned.

FIELD OF THE INVENTION

This invention relates generally to a dynamic random access memory (DRAM) part having a write per bit feature, and particularly relates to such a part having mask write latches, for holding each bit of the write per bit mask information, coupled to the data path past the input data latch.

DESCRIPTION OF THE RELATED ART

Present DRAM parts often include a feature called write per bit. The write per bit feature usually occurs in memory parts reading and writing data words formed of plural bits. The write per bit feature provides for the processor circuits to write mask information to the memory part and provides for the memory parts to control writing of only selected bits of a data word or words received from the processor circuits in response to the write mask information.

Several types of operations benefit from this write per bit feature. Graphics display systems represent one pixel with one multi-bit data word, with different groups of bits in each word representing different colors. To change the value of only one color in a pixel or across a screen of pixels, the processor circuits will write to only the data bits for that one color in one data word or to all of the data words representing the pixels. In other situations, the processor circuits want to change only a certain bit or bits in a data word.

Previous to the write per bit feature, the processor circuits performed a read of the desired data word from the addressed memory location, modified the data word in the central processing unit and performed a write of the data word back to the addressed memory location. This activity consumed much time in reading and writing the whole data word when only one or a few bits needed to be modified.

The write per bit feature provides for the processor circuits to write mask information to a write ask latch inside the memory part early in a memory write cycle and then write a full word of data, including the bits to be changed, to the memory part at the regular time in the write cycle. The write mask latch and other control circuits in the memory part then operate during access of the addressed memory word to write to the respective bit locations in the addressed memory word only the bits indicated by the mask latch information. U.S. Pat. Nos. 4,636,986 and 4,817,058 further disclose details of these circuits and operations.

In implementing the write per bit feature, the mask information comes to the memory part over the data lines in a time multiplexed fashion before the data in a memory write cycle. The parallel bits of the mask information pass through respective data input register TTL level buffer circuits and multiplexer circuits to their respective bit positions in the mask write latch circuits, which have been located close to the level buffer and multiplexer circuits. A suitable control signal such as $WM_{13}$ LATCH latches the mask information into the mask latch. Later in the memory cycle, the data passes through the same TTL level data buffers and multiplexer circuits to the respective bit positions in data latch circuits, which are also located close to the level buffer and multiplexer circuits. A suitable control signal, such as $DATA_{13}$ LATCH, latches the data into the data latch circuits. The data then pass over data lines and global I/O line in the chip to the respective local I/O buffer circuits near the sense amplifiers. The mask information passes over its own set of mask information lines, separate from and parallel to the lines used for data, to the respective local I/O buffer circuits. The local I/O buffer circuits connect to the sense amplifiers for the addressed memory word over the local I/O lines and the local I/O buffer circuits pass and block the data to the sense amplifiers depending upon the sense of each write mask bit.

When the memory part reads and writes data words having four bits, routing four metal lines on the silicon chip to the local I/O buffer circuits to carry the mask information in addition to the four metal lines for the data causes little concern. A problem arises however when a memory part reads and write wide data words having 8, 16, 32 or 64 bits. Providing 8, 16, 32 or 64 additional metal lines across the chip for the mask information requires substantial area and substantially increases the area or size of the chip.

SUMMARY OF THE INVENTION

The claimed invention moves the write mask latches from adjacent the level buffer and multiplexer circuits to adjacent the respective local I/O buffer circuits. The write mask information then passes across the data lines from the TTL level buffers, through the data latches and across the data lines and global I/O lines to the mask latches that are located adjacent the respective local I/O buffer circuits. The mask information thus passes over the same data lines that the data latter pass over in route to the local I/O buffer circuits. This implementation significantly reduces the number of metal lines that need to be routed over the surface of the memory chip and provides for a smaller memory chip.

The claimed memory part provides a data path on a substrate of semiconductor material for each bit of data in a word of data. Each data path occurs on a data line extending from a data bond pad through at least a level shifting buffer, a data latch, and a local input-output buffer, to a sense amplifier. A write mask latch for that data bit couples to the data path between the data latch and the sense amplifier. Preferably the write mask latch occurs adjacent the local input-output buffer.

The claimed process of writing data on a data path extending on data lines from a bond pad through a data latch to a memory cell in a dynamic random access memory part comprises two steps. One step is writing write mask information on the data path from the bond pad through the data latch to the mask register coupled to the data path. The other step is writing data on the data path through the data latch to the memory cell responsive to the mask information contained in the mask latch.

DETAILED DESCRIPTION

The present invention is used in a family of DRAM devices constructed and arranged to furnish one million words of sixteen parallel bits, also identified by the symbol 1M×16.

Figure 1:
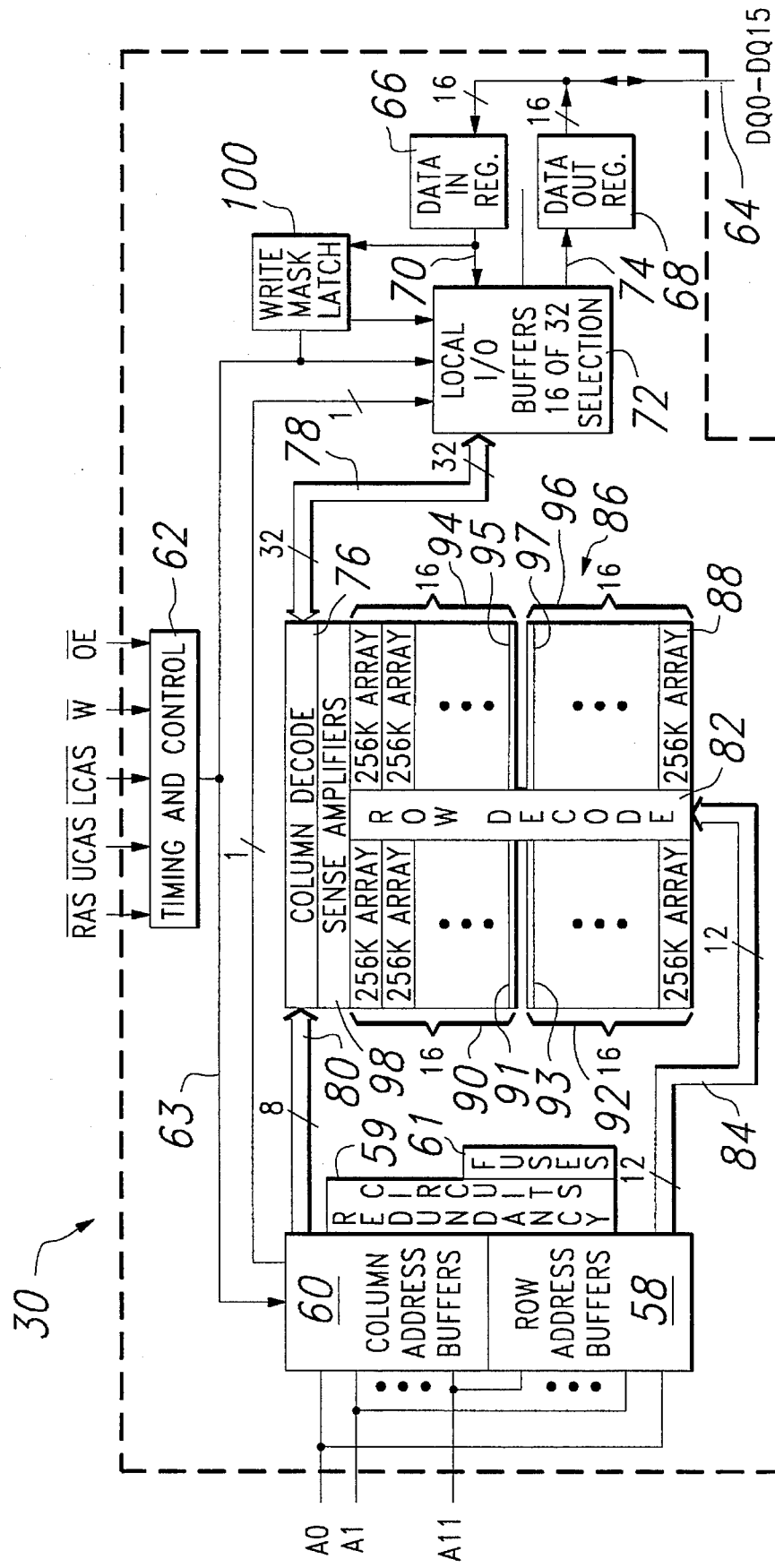
FIG. 1 is an idealized block diagram of a dynamic random access memory part including the claimed invention.

In FIG. 1, DRAM part 30 receives address signals A0–A11 in row address buffers 58 and column address buffers 60. The address signals become latched in the address buffers by use of control signals: Row Address Strobe, $RAS_{13}$, Upper Column Address Strobe, $UCAS_{13}$, Lower Column Address Strobe, $LCAS_{13}$, Write, $W_{13}$ and Output Enable, $OE_{13}$, received in timing and control block 62. Leads 63 carry desired timing and control signals from block 62 to buffers 58 and 60.

Redundancy circuits 59 and fuse circuits 61 connect with the address information received in row and column buffers 58 and 60 to select redundant rows and columns of memory cells for replacing defective memory cells. The determination of fuses to be blown and left alone to select redundant memory cells occurs after testing. The part is fabricated and then tested; repairable parts are acted upon by such as a laser that blows appropriate fuses in fuse circuits 61 and selects redundant rows and columns of memory cells to produce a saleable part.

Data signals DQ0–DQ15 are carried in parallel on leads 64 to data in register 66 and data out register 68. Sixteen data signals in parallel pass across leads 70 from data in register 66 to the 16 local I/O buffers 72 and 16 data signals in parallel pass across I/O leads 74 from the 16 local I/O buffers 72 to the data out register 68. Sixteen data signals in parallel pass from the local I/O buffers 72 to the column decoders 76 across leads 78. The local I/O buffers 72 also receive timing and control signals over leads 63 from timing and control block 62. Column decoders 76 receive 8 address signals in parallel across leads 80 from column address buffers 60. Row decoders 82 receive 12 address signals in parallel over leads 84 from row address buffers 58.

Column decoders 76 and row decoders 82 address individual memory cells in array 86, which includes 16,777,216 data bits configured in 1,048,576 (1M) words by 16 bits per word. Array 86 contains 64 subarrays, such as subarray 88, with each subarray containing 256K of data bits. Array 86 arranges the subarrays in four quadrants 90, 92, 94, and 96, with 16 subarrays in each quadrant. Each of the subarrays contain redundant memory cells arranged as redundant rows and redundant columns; these redundant memory cells are schematically represented at blocks 91, 93, 95, and 97. The redundant rows become selected by the row address signals received over leads 84 and the redundant columns become selected by the column address signals received over leads 80.

FIG. 1 depicts the subarrays in an idealized way between row decoders 82 and sense amplifiers 98. In the actual part, the row decoders can be arranged between the quadrants and the sense amplifiers can be located between the subarrays. The data signals from the selected rows of data bits in the array parts pass through the sense amplifiers 98 to column decoders 76.

Control signals Write, W__, and Output enable, OE__, connect to timing and control block 62 to indicate and control the writing and reading of data signals from overall array 86.

Please understand that this text uses an underline character following the name or acronym for a signal to indicate the active low state. This facilitates text preparation using a Word processor, even though the drawing may use an overscore to indicate the active low state.

DRAM part 30 also includes many other peripheral circuits to implement reading, writing and storage of data or information in part 30, and to implement the write per bit feature. Some of these circuits include write mask latch circuits 100 connected along the data path to receive write mask information from leads 70 and supply write mask information to the local I/O buffer circuits 72. Write mask latch circuits 100 receive control signals from timing and control circuits 62 over leads 63. Although not readily depicted in the idealized representation of FIG. 1, which by necessity must omit much fine detail, each of the write mask latches physically occurs adjacent to each of the local I/O buffers 72. This avoids routing a long, separate write mask bit line from adjacent the data in register 66 to the local I/O buffer 72. With this change in location of the mask write latches from adjacent the data input registers 66 to adjacent the local I/O buffers 72, the write per bit circuits operate substantially the same as before under control of substantially the same control signals.

Figure 2:
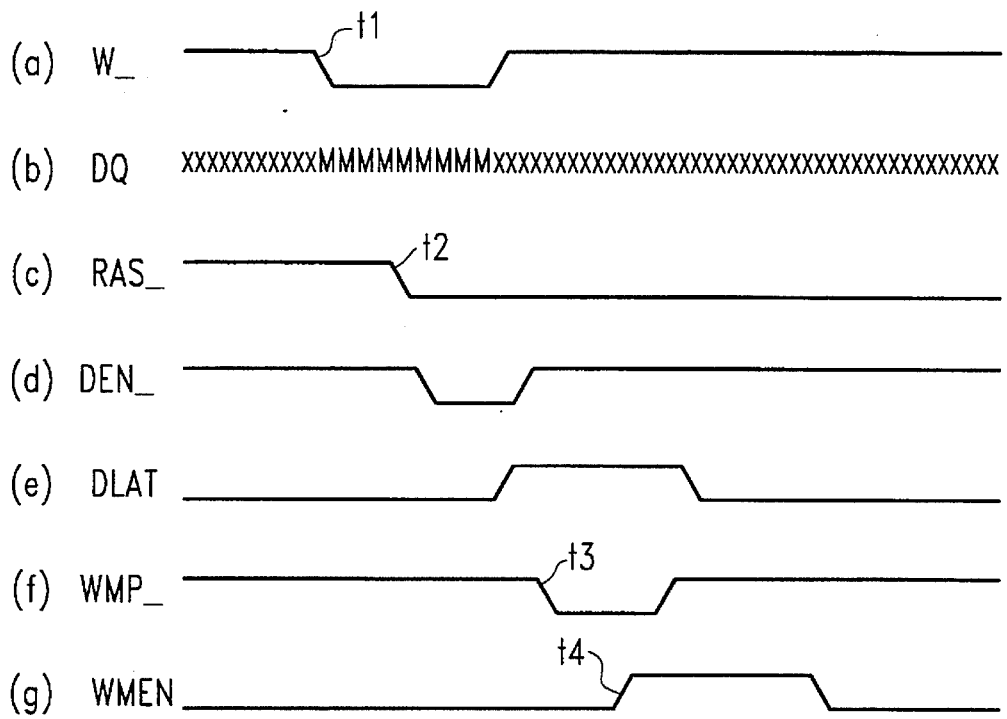
FIG. 2 is a timing diagram of a write per bit operation.

In FIG. 2(a), the external write signal W__goes to a low state at time t1. In FIG. 2(b), the DQ data lines carry the write per bit write mask information, represented by capitol Ms, at time t1. This write mask information M occurs substantially during the time that the external write signal $W_{13}$ is active low. In FIG. 2(c), the signal Row Address Strobe RAS__ goes low at time t2 substantially during the period that the DQ data lines carry the write mask information. The signal RAS__stays low for a length of time extending on to FIG. 3(c).

In FIGS. 2(d) and 2(e), the data enable signal DEN__and the data latch signal DLAT, respectively go active and inactive internal of part 30 to enable data latches and latch data into those latches. In FIG. 2(f), a write mask pulse WMP__occurs at time t3, after the occurrence of the data enable and data latch signals. In FIG. 2(g), the write mask enable signal WMEN is normally low and goes high at time t4. The write mask pulse and write mask enable signals are used internal of part 30 to capture and latch write mask information into the write mask latch 100.

Figure 3:
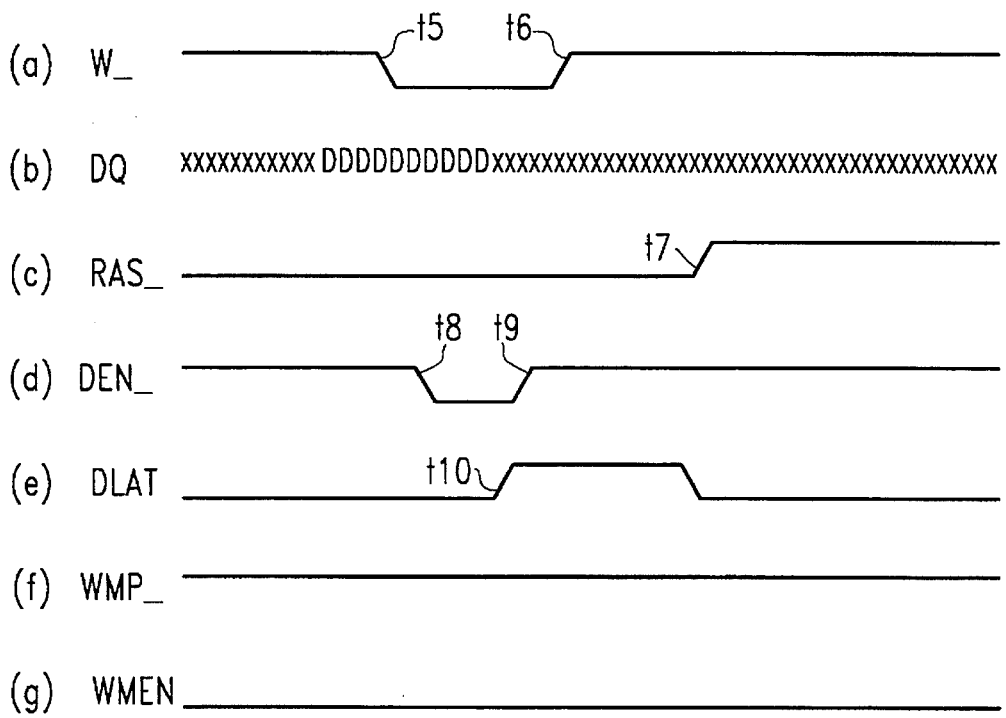
FIG. 3 is an extension along the time axis of the timing diagram of FIG. 2.

In FIG. 3(a), the external write signal goes active low at time t5 and returns high at time t6. In FIG. 3(b), the data line signals DQ carry the data signals, indicatedby the capitals Ds, during the falling edge of the write enable signal W__at time t5. In FIG. 3(c), the RAS__remains low until time t7 at which time it goes high. In FIG. 3(d), the data enable signal DEN__pulses low between times t8 and t9 to enable the data latches to receive the data carried on the DQ data lines.

In FIG. 3(e), the signal DLAT goes high at time t10 to latch the data signals in the data latches. In FIGS. 3(f) and 3(g), the signals write mask pulse WMP__and right mask enable WMEN remain quiescent during the receipt of data by part 30.

Figure 4:
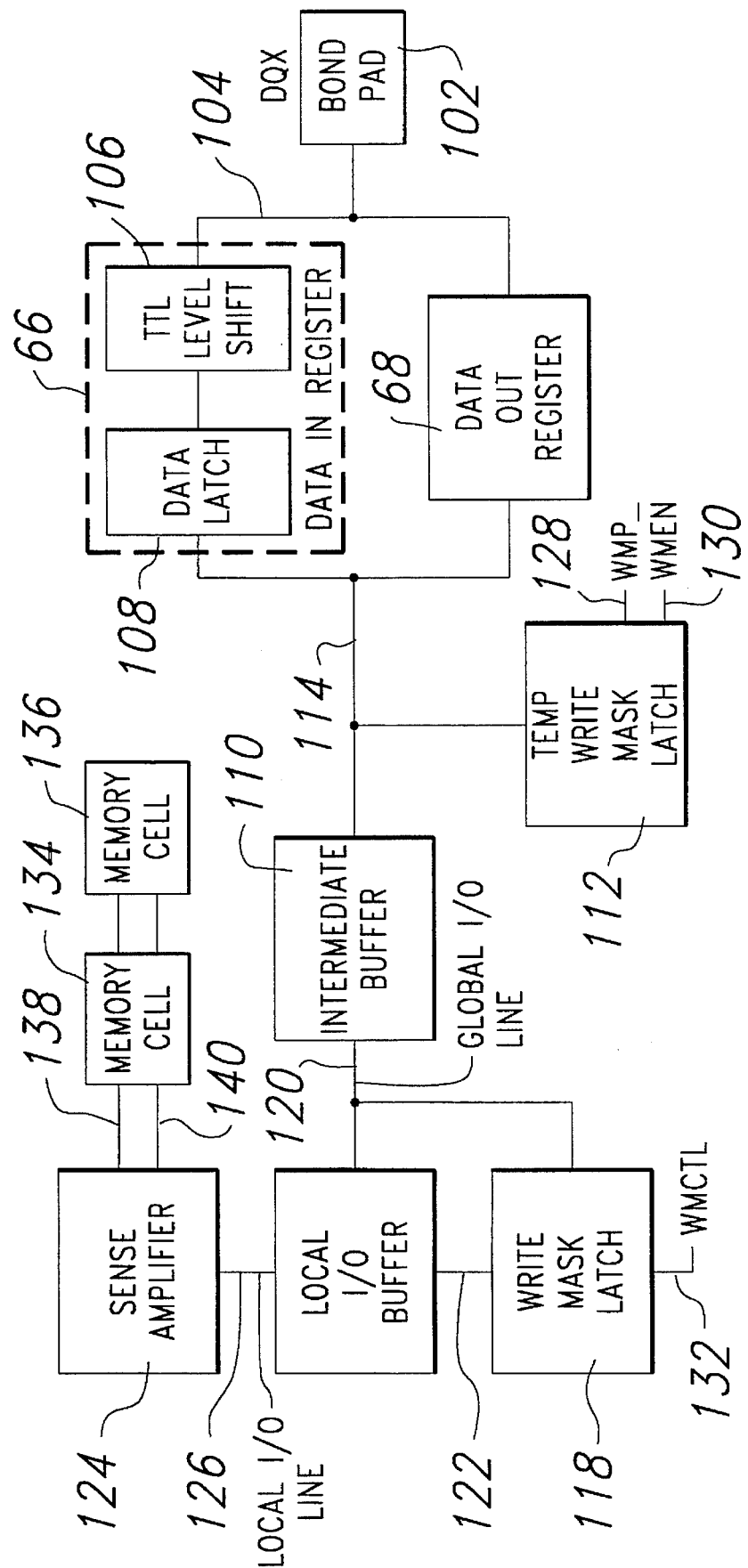
FIG. 4 is an idealized block diagram of the data path on the memory part including the connection of the write mask latch to the data path according to the invention.

FIG. 4 presents an idealized representation of a data path for one bit of data and mask write information on part 30. The data path receives an external data signal DQX on bond pad 102. Bond pad 102 connects to data in register 66 and data out register 68 over line 104. Data in register 66 includes TTL level shifting circuits 106 and data latch circuits 108. The TTL level shifting circuits 104 provide the normal function of translating the TTL levels of the DQX data received by part 30 to the voltage levels used internal to part 30. Data latch circuits 108 perform the previously described function of latching the DQX data in the part 30. Output buffer 68 provides the drive to produce DQX data bit signals at bond pad 102 for transmission from part 30.

Data in register 66 and data out register 68 connect to intermediate buffer 110 and temporary write mask latch 112 over data line 114, which represents a specific implementation of lines 70 and 74 of FIG. 1. Intermediate buffer 110 connects to local I/O buffer 116 and the write mask latch 118 over global I/O line 120. The output of the write mask latch 118 occurs as write mask bit WMBX on line 122. The local I/O buffer 116 connects to sense amplifier 124 over local I/O line 126.

From the sense amplifier 124, the data path extends to individual memory cells such as memory cells 134 and 136 over bit lines 138 and 140. The reading of data occurs from memory cells 134 and 136 across the data path to the bond pad while the writing of data occurs from the pond pad to the memory cells 134 and 136. The data path thus extends from the bond pad 102, through data in register 66, intermediate buffer 110, local I/O buffer 116, and sense amplifier 124 to memory cells 134 and 136.

The temporary write mask latch 112 momentarily holds the write mask bit from the data line 114 after the write mask bit passes through the data in register 66. This allows the data in register 66 to switch to received data as soon as possible. Temporary write mask latch 112 receives the signal WMP_ on line 128 and receives the write mask enable signal MEN on lead 130.

The write mask latch 118 receives the bit of write mask information from the global I/O line and latches that bit in response to the control signal write mask control WMCTL received on line 132.

Providing the write mask latch 118 adjacent to or local to the local I/O buffer 116 significantly reduces the number of lines such as data line 114 and global I/O 120 that need to be routed from the input and output buffers to the local I/O buffer to effect the write per bit feature. Previously, the write mask latch would have been provided adjacent the data latch 108 between the data in register 66 and the intermediate buffer 110. An additional line then would be routed parallel to data line 114 and global I/O line 120 to the local I/O buffer 116.

The size of the circuits implementing the write mask latch 118 are small and so placing them adjacent the local I/O buffer 116 results in substantially no area penalty. Placing the temporary write latch 112 on the data line 114 effects a conservative design to insure the integrity of the write mask information bit on data line 114 while allowing the data in register 66 sufficient time to capture the closely timed and following DQX data bit. The circuits implementing the temporary write mask latch 112 also are small and so providing this additional temporary latch also results in substantially no area penalty. The area saved by moving the write mask latch 118 to adjacent the local I/O buffer 116 includes the area required for the width of the extra write mask bit line extending for the distance from adjacent the data in registers to the local I/O buffer and includes the spacing required between the write mask bit line and the data lines or that same length.

Figure 5:
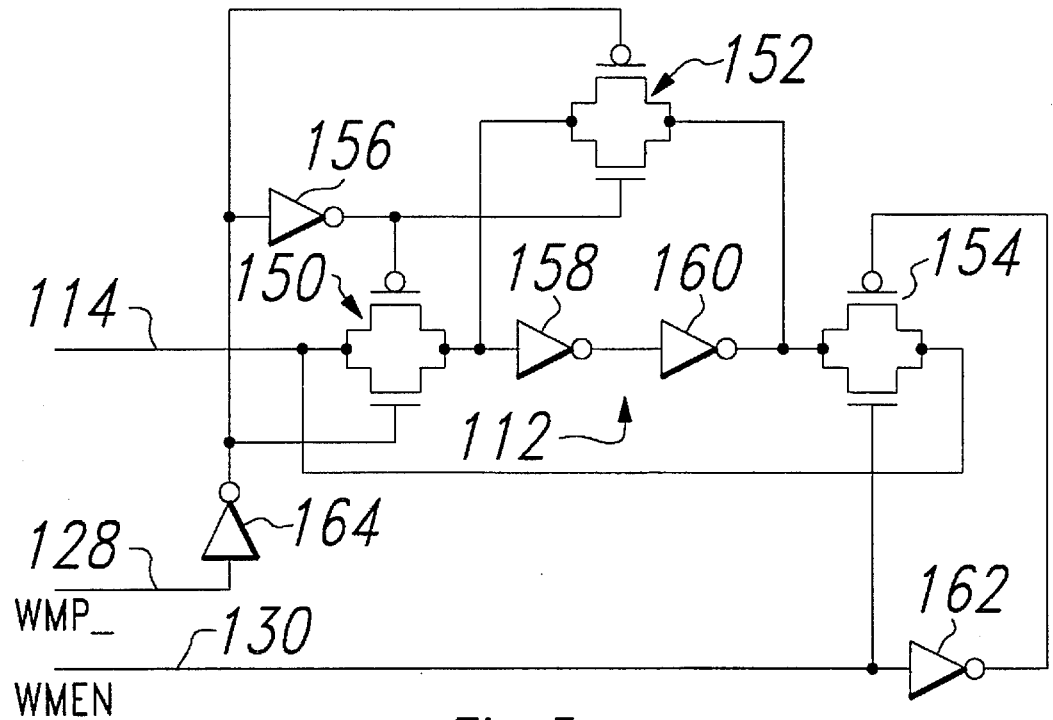
FIG. 5 is a schematic diagram of a temporary write mask latch used with the invention.

In FIG. 5, temporary write mask latch 112 comprises pass transistors 150, 152 and 154 and inverters 156, 158, 160, 162 and 164. In operation, the signal WMP_going to an active low allows the latch to open and take the write mask bit from the data leads 114. The signal WMEN then latches the information in the temporary write mask latch 112.

Figure 6:
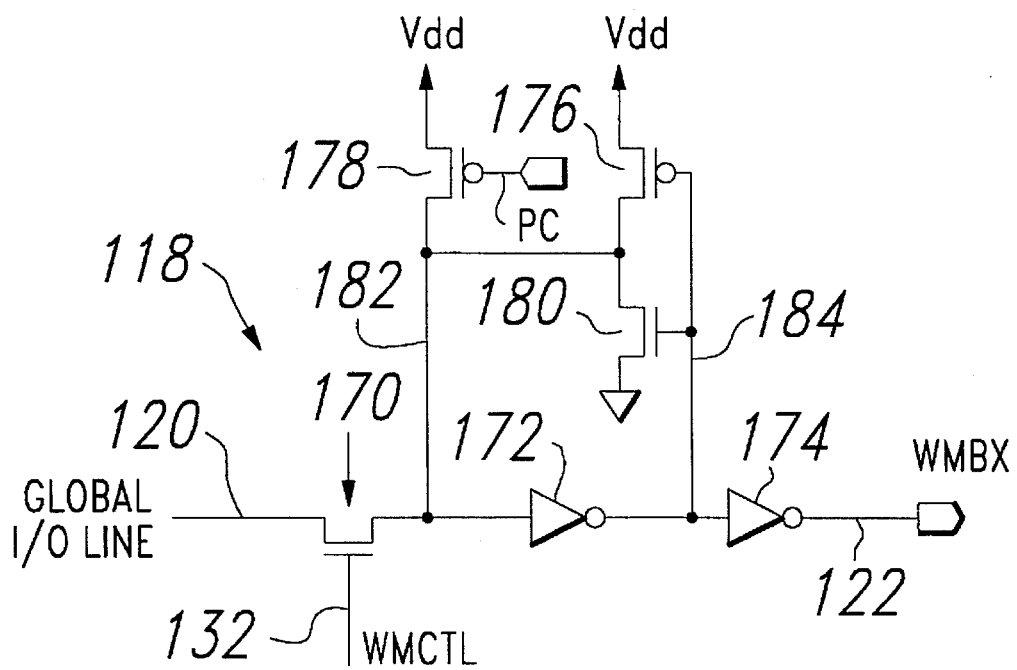
FIG. 6 is a schematic diagram of the write mask latch for one bit of write mask information.

In FIG. 6, the write mask latch 118 comprises N-channel transistor 170, inverters 172 and 174, P-channel transistors 176 and 178 and N-channel transistor 180. The write mask latch 118 becomes precharged high during a precharge cycle by the signal PC on the gate of transistor 178 going low. This connects Vdd to line 182 and after propagating through inverter 172 drives line 184 low. A low on line 184 propagates through inverter 174 to cause a logical high at lead 122 for signal WMBX. The signal WMBX being high enables writing of data from the global I/O line through the I/O buffer to the sense amplifier and addressed memory cell.

After the precharge cycle, the write mask control lead signal WMCTL on line 132 going high connects the global I/O line 120 to the line 182. The state of the write mask bit from the global I/O line 120 becomes latched through inverter 172 and transistors 176 and 180 to appear as the output signal WMBX. The signal WMBX being low disables the local I/O buffer 116 from writing data from the global I/O lines 120 to the sense amplifier 124. This occurs in a manner identical to the disabling of writing a bit of data previous to the present invention.

The disclosed embodiment can be modified and varied while remaining within the scope of the following claims. For example, the particular transistors and circuit arrangements used for implementing the temporary write mask latch 112 and write mask latch 118 can be varied while obtaining the same advantages. Further, the specific implementation of the data path from the bond pad 102 to the memory cells 134 and 136 can be varied as desired and varied to accommodate other features such as row redundancy and varying configurations of refresh and width of data words.

We claim:

1. A dynamic random access memory device formed on a substrate of semiconductor material and providing a write per bit feature, the device comprising:

a semiconductor component;

a data path on the substrate that extends from a data bond pad through the semiconductor component to an input-output buffer for exchanging data signals between the bond pad and the input-output buffer; and a write mask latch coupled to the data path, the write mask latch receiving mask write information applied to the bond pad and transmitted on the data path through the semiconductor component, the write mask latch coupled to the input-output buffer for controlling transmission of data signals therethrough.

2. The dynamic random access memory device of claim 1 in which the data path carries one data bit, the input-output buffer is a local input-output buffer connected to a sense amplifier and the write mask latch is formed in the substrate of semiconductive material adjacent the local input-output buffer and latches one bit of write mask information from the data path.

3. The dynamic random access memory device of claim 1 in which the data path from the bond pad carries a bit of write mask information and then carries a bit of data.

4. The dynamic random access memory device of claim 1 in which the data path includes an intermediate buffer between the bond pad and the local input-output buffer and including a temporary write mask latch connected to the data path between the data in latch and the intermediate buffer.

5. A process of effecting a write per bit feature in writing data on a data path from a bond pad through a semiconductor component to a memory cell in a dynamic random access memory device, the process comprising the steps of:

a. writing write mask information across the data path from the bond pad through the semiconductor component to, a mask register the mask reqister coupled to the data path for controlling data transmitted thereon; and b. writing data on the data path through the semiconductor element and to the memory cell in response to the write mask information contained in the mask latch.

6. The process of claim 5 further including the steps of;

temporarily latching the write mask information in data in latch for presentation on the data path between the data in latch and the memory cell, and then latching data in the data in latch for presentation on the data path between the data in latch and the memory cell.

7. The process of claim 5 further including the step of:

temporarily storing the write mask information in a temporary mask register prior writing the write mask information in the mask register, the write mask being positioned between the bond pad and the semiconductor component.

8. Apparatus for implementing a write per bit feature in a dynamic random access memory unit; the dynamic random access memory unit having an input register, an intermediate buffer, and a memory cell; the apparatus comprising:

a write mask latch coupled to an output terminal of the intermediate buffer for storing write mask information therein; and a local I/O buffer coupled between the intermediate buffer and the memory cell, the local I/O buffer responsive to the write mask information in the write mask latch for controlling the transfer of data from the local I/O buffer to the memory cell.

9. The apparatus of claim 8 further comprising a temporary write mask register coupled between the input register and the intermediate buffer, the temporary write mask register temporarily storing write mask information.

* * * * *